United States Patent [19]
Chai et al.

[11] Patent Number: 5,504,882
[45] Date of Patent: Apr. 2, 1996

[54] FAULT TOLERANT DATA STORAGE SUBSYSTEM EMPLOYING HIERARCHICALLY ARRANGED CONTROLLERS

[75] Inventors: Philip K. Chai; Chan Y. Ng, both of San Jose; John R. Paveza, Morgan Hill; Lloyd R. Shipman, Jr., San Jose; Christ J. Xydes, Gilroy, all of Calif.

[73] Assignee: International Business Machines Corporation, Armonk, N.Y.

[21] Appl. No.: 263,896

[22] Filed: Jun. 20, 1994

[51] Int. Cl.$^6$ .................................................. G06F 15/00
[52] U.S. Cl. ................. 395/182.03; 395/427; 364/268.9
[58] Field of Search ..................................... 395/578, 400, 395/425; 364/268, 268.1, 268.8, 268.6, 268.9

[56] References Cited

U.S. PATENT DOCUMENTS

| | | | |
|---|---|---|---|
| 3,964,056 | 6/1976 | Charpentier et al. | 340/172.5 |
| 4,092,732 | 5/1978 | Ouchi | 364/900 |
| 4,608,688 | 8/1986 | Hansen et al. | 371/11 |
| 4,667,326 | 5/1987 | Young et al. | 371/40 |
| 4,825,403 | 4/1989 | Gershenson et al. | 364/900 |
| 4,942,579 | 7/1990 | Goodlander et al. | 371/51 |
| 4,993,030 | 2/1991 | Krakaner et al. | 371/40.1 |
| 5,051,887 | 9/1991 | Berger et al. | 364/200 |
| 5,140,592 | 8/1992 | Idleman et al. | 371/8.1 |
| 5,249,279 | 9/1993 | Schmenk et al. | 395/425 |
| 5,313,626 | 5/1994 | Jones et al. | 395/575 |
| 5,396,596 | 3/1995 | Hashemi et al. | 395/250 |

OTHER PUBLICATIONS

D. Patterson et al., "A Case for Redundant Arrays of Inexpensive Disks (RAID)" pp. 109–116.

Garth A. Gibson, "Performance and Reliability in Redundant Arrays of Inexpensive Disks", pp. 381–391.

The Interpreter "Competition Heats Up in Growing Fault–Tolerant Computer Market", Mini–Micro Systems, Jan. 1994.

James A. Katzman, Tandem Computers "The Tandem 16: A Fault-Tolerant Computing System", Chapter 29, 1977, pp. 470–485.

Primary Examiner—Vincent P. Canney
Attorney, Agent, or Firm—Esther Klein; Andrew J. Dillon

[57] ABSTRACT

A fault tolerant disk storage subsystem which includes a multipath dynamically alterable hierarchical arrangement of storage device controllers. Multiple storage device controllers are provided which are each adapted to emulate a storage device and which each include a cache memory which has multiple data input ports and multiple data output ports. A processing element within the storage device controller is utilized to selectively interconnect particular data input ports with selected data output ports to provide multiple paths within the storage device controller. An interconnection is then provided for coupling a data output port of one or storage device controller with a data input port of one more alternate storage device controllers which emulate storage devices, creating an alterable hierarchical arrangement of storage device controllers. Storage devices are then coupled to each of the lowest levels of the hierarchical arrangement of storage device controllers. As the storage device controllers may very in type and capability, various combinations of access speed and redundancy may be provided.

18 Claims, 5 Drawing Sheets

FAULT TOLERANT DATA STORAGE SUBSYSTEM EMPLOYING HIERARCHICALLY ARRANGED CONTROLLERS

BACKGROUND OF THE INVENTION

1. Technical Field:

The present invention relates in general to an improved data processing system and in particular to a fault tolerant data storage subsystem for utilization within a data processing system. Still more particularly, the present invention relates to a data storage subsystem which includes a multi-path dynamically alterable hierarchical arrangement of storage device controllers.

2. Description of the Related Art:

A typical data processing system generally includes one or more memory units which are connected to a central processor unit either directly or indirectly through a control unit and a channel. The function of these memory units is to store data and programs which are utilized by the central processing unit in performing a given data processing task.

Various types of memory units are utilized in current data processing systems. The response time and capacities of these different memory types vary significantly, and in order to maximize system throughput the choice of a particular type of memory unit generally involves matching its response time to the requirement of the central processing unit and its capacity to the data storage needs of the data processing system. To minimize the impact on systems throughout the data processing system, which result from the utilization of slow access storage devices, many data processing systems employ a number of different types of memory units. Since access time and capacity also affect the cost of storage, a typical system may include a fast access small capacity directly accessible monolithic memory for data that is utilized frequently and a series of tape memory devices or disk memory devices which are connected to the system through respective control units for data which is utilized less frequently. The storage capacities of these later units are generally several orders of magnitude greater than the semiconductor memories utilized within data processing systems and hence, the storage cost per byte of data is considerably less.

Computer systems are currently being developed in which the amount of data to be manipulated by the system is immense. For example, data storage systems have been proposed that are capable of handling amounts of data on the order of exabytes, spread across hundreds of direct access storage devices (DASD). Individual files for such systems have been proposed to be as high as ten gigabytes. Such large storage systems should be very reliable since restoring an entire storage system after a fault could take many hours or days. In addition, such storage systems should sustain very high data transfer rates in order to permit efficient utilization of the data.

It should therefore be apparent that it would be desirable that no single point of failure should be permitted to cause a large data processing system to lose access to memory.

The prior art has suggested several techniques for solving this problem. The most straightforward approach provides the utilization of a duplicate set of storage devices or memory units which keep a duplicate of all data, While this solution solves the data reliability problem this solution involves duplicating the cost of storage and some impact on system performance occurs since any change to stored data requites writing two records. Also, an added requirement of keeping track of where the duplicate records are kept is needed, in the event the primary records are not available.

Alternately, some systems utilize so-called "Error Correction Codes" (ECC) bits which are appended to data records or groups of data records. Utilizing error correction code logic it is possible to correct a small amount of data that may be read erroneously utilizing these bits.

More recently, the utilization of large redundant arrays of inexpensive disks, commonly known as "RAID" have been proposed. Such arrays offer the opportunity to achieve high data reliability at a lower cost than conventional methods which are based upon complete duplication of data. Various configurations of disk arrays have been proposed utilizing RAID technology and such systems typically provide high data reliability and availability. High data reliability means that the expected time to data loss is very long and the high availability of such systems means that the time spent repairing systems and recovering lost data is a small fraction of total time. While these arrays of disks provide enhanced data reliability, such systems are still prone to data loss in the event an error or fault occurs which is of sufficient magnitude to interrupt the recovery of data.

One proposed approach for overcoming these problems is set forth in Idleman et al., U.S. Pat. No. 5,140,592. The method and apparatus set forth therein propose enhancing the reliability of disk array systems by utilizing a controller device which is split into a first level and second level controller. The first and second level controllers are interconnected in a manner such that a failure of the second level controller associated with a first level controller will result in a switching of a peer controller into the path utilized by the faulting second level controller. While this system does provide some security from controller faults, the necessity of providing specialized interconnected controllers in which the control function is divided between two different levels of storage device controllers creates an added complexity which is more difficult to implement and maintain.

It should thus be apparent that a need exists for a fault tolerant data storage subsystem which may be simply and efficiently implemented utilizing standard technology and which provides a high degree of reliability within the memory storage subsystem.

SUMMARY OF THE INVENTION

It is therefore one object of the present invention to provide an improved data processing system.

It is another object of the present invention to provide a fault tolerant data storage subsystem for utilization within a data processing system.

It is yet another object of the present invention to provide an improved data storage subsystem which includes a multipath dynamically alterable hierarchical arrangement of storage device controllers.

The foregoing objects are achieved as is now described. Multiple storage device controllers are provided which are each adaptable emulate a storage device and which each include a cache memory which has multiple data input ports multiple data output ports. A processing element within the storage device controller is utilized to selectively interconnect particular data input ports with selected data output ports to provide multiple paths within the storage device controller. An interconnection is then provided for coupling a data output port of one storage device controller with a data input port of one or more alternate storage device controllers which emulate storage devices, creating an alterable hierarchical arrangement of storage device controllers. Storage devices are then coupled to each of the lowest levels of the hierarchical arrangement of storage device controllers. As the storage device controllers may vary in type and capability, various combinations of access speed and redundancy may be provided.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
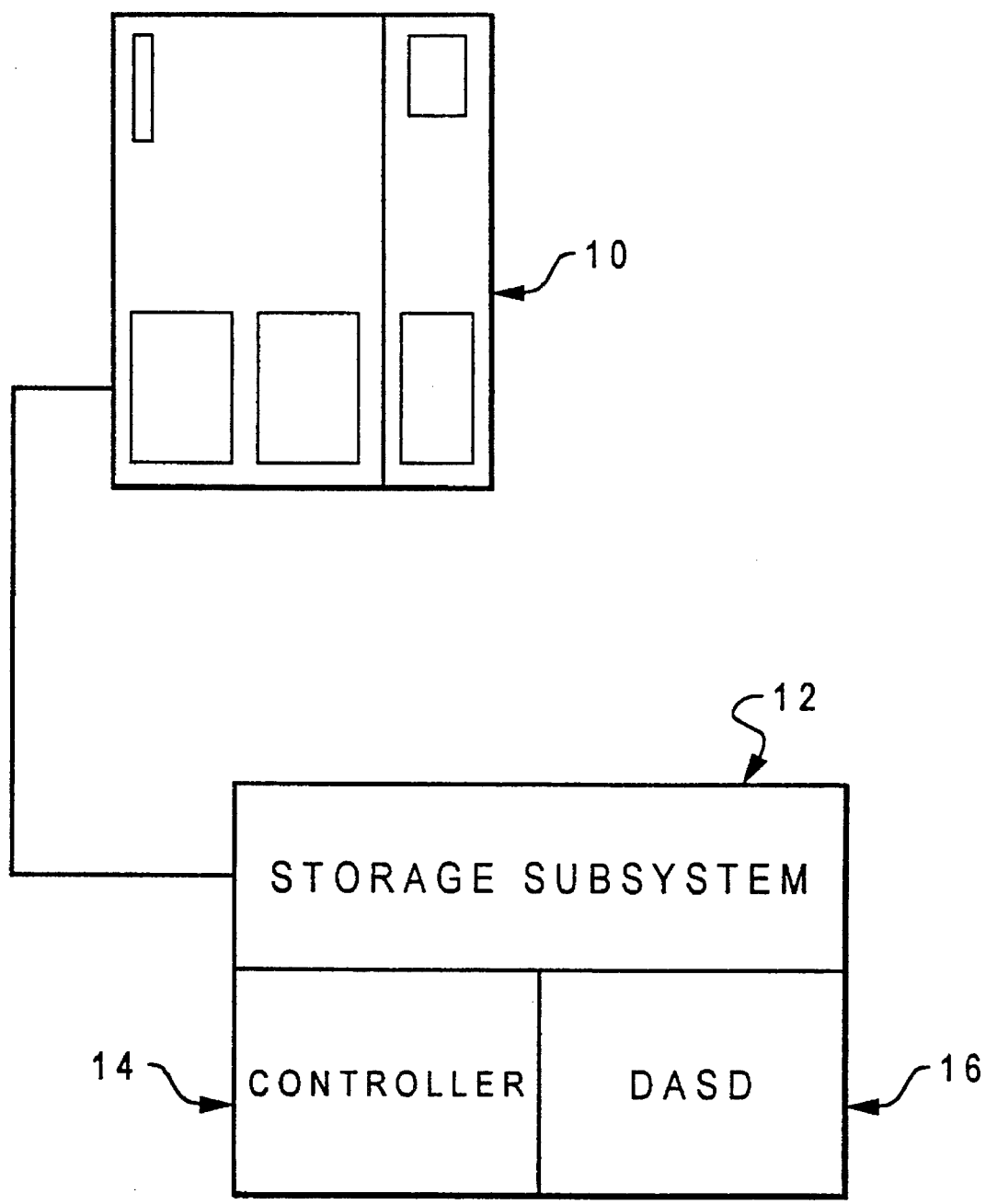
FIG. 1 is a partially schematic pictorial representation of a data processing system which may be utilized to implement the method and system of the present invention.

With reference now to the figures and in particular with reference to FIG. 1, there is depicted a partially schematic pictorial representation of a data processing system which may be utilized to implement the method and system of the present invention. As illustrated, the data processing system includes a host processor 10 which may be implemented utilizing any suitable computer such as, for example, the International Business Machines AS/400 computer. Additionally, a storage subsystem 12 is shown coupled to host processor 10. As is common in such storage subsystems a controller 14 and one or more direct access storage devices 16 are also illustrated within storage subsystem 12. Thus, in manner which should be apparent to those having ordinary skill in the art, data utilized by host processor 10 may be stored and retrieved from one or more direct access storage devices within storage subsystem 12.

Figure 2:
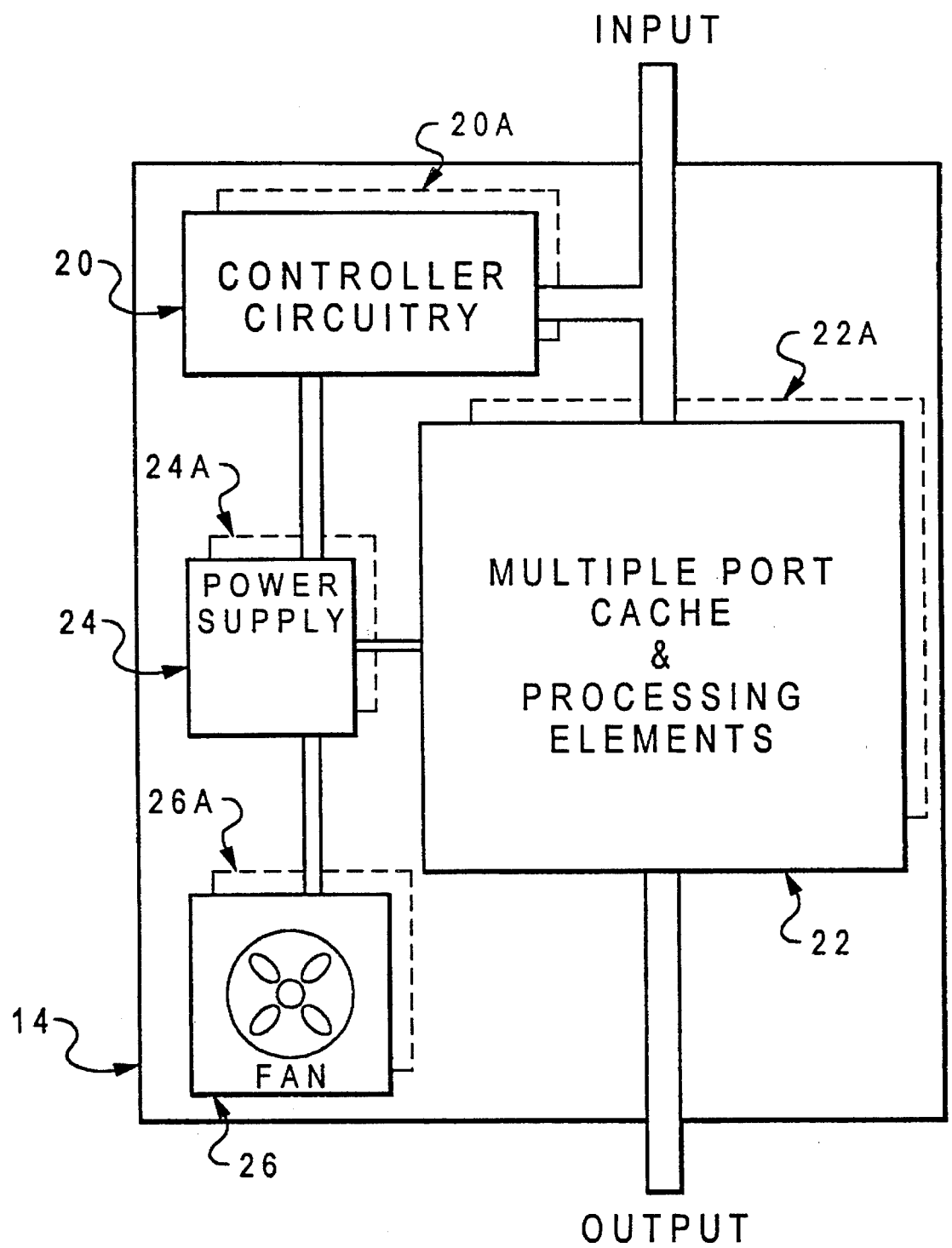
FIG. 2 is a high level block diagram of a storage device controller which may be utilized to implement the fault tolerant data storage subsystem of the present invention.

Referring now to FIG. 2, there is depicted a high level block diagram of a storage device controller which may be utilized to implement the fault tolerant data storage subsystem of the present invention. As illustrated, storage device controller 14 includes controller circuitry 20 and a multiple port cache with processing elements 22. An input to storage device controller 14 is provided for receiving data and, in combination with storage device controller 14, multiple port cache and processing elements 22 may be utilized to emulate a storage device. Thus, storage device controller 14 may be coupled to a host processor and utilized to provide control of the storage of data within multiple disk memory devices in a manner transparent to the host processor.

Also depicted within FIG. 2 is power supply 24 and backup power supply 24A. Those skilled in the art will appreciate that the provision of redundant power supplies which are controlled utilizing controller circuitry 20 can provide for a higher degree of reliability for the system in that the failure of a primary power supply will become transparent to the system as a result of the ability of storage controller 14 to seamlessly switch to backup power supply 24A.

Similarly, cooling fan 26 is depicted along with backup cooling fan 26A. In the manner set forth above, these redundant cooling fan systems may be utilized to ensure that the failure of a cooling fan will not result in the loss of storage device controller 14 clue to an overheating condition. In a like manner, backup controller circuitry 20A and backup multiple port cache 22A are also schematically illustrated within FIG. 2. In this manner, a catastrophic failure of any element within storage device controller 14 may be overcome by switching to a backup. Each of these backup switching techniques may be accomplished in a manner well known in the art.

Thus, in the manner depicted within FIG. 2, those skilled in the art will appreciate that it is possible to provide a storage device controller having multiple redundant subsystems and a multiple port cache and processing elements which is capable of emulating a disk memory device. The storage device controller of FIG. 2 may be implemented utilizing the International Business Machines Corporation 3990 Storage Control Unit. Both the Model 3 and Model 6 3990 Storage Control Unit provide a multiple port cache and processing elements in the manner set forth within FIG. 2.

Figure 3:
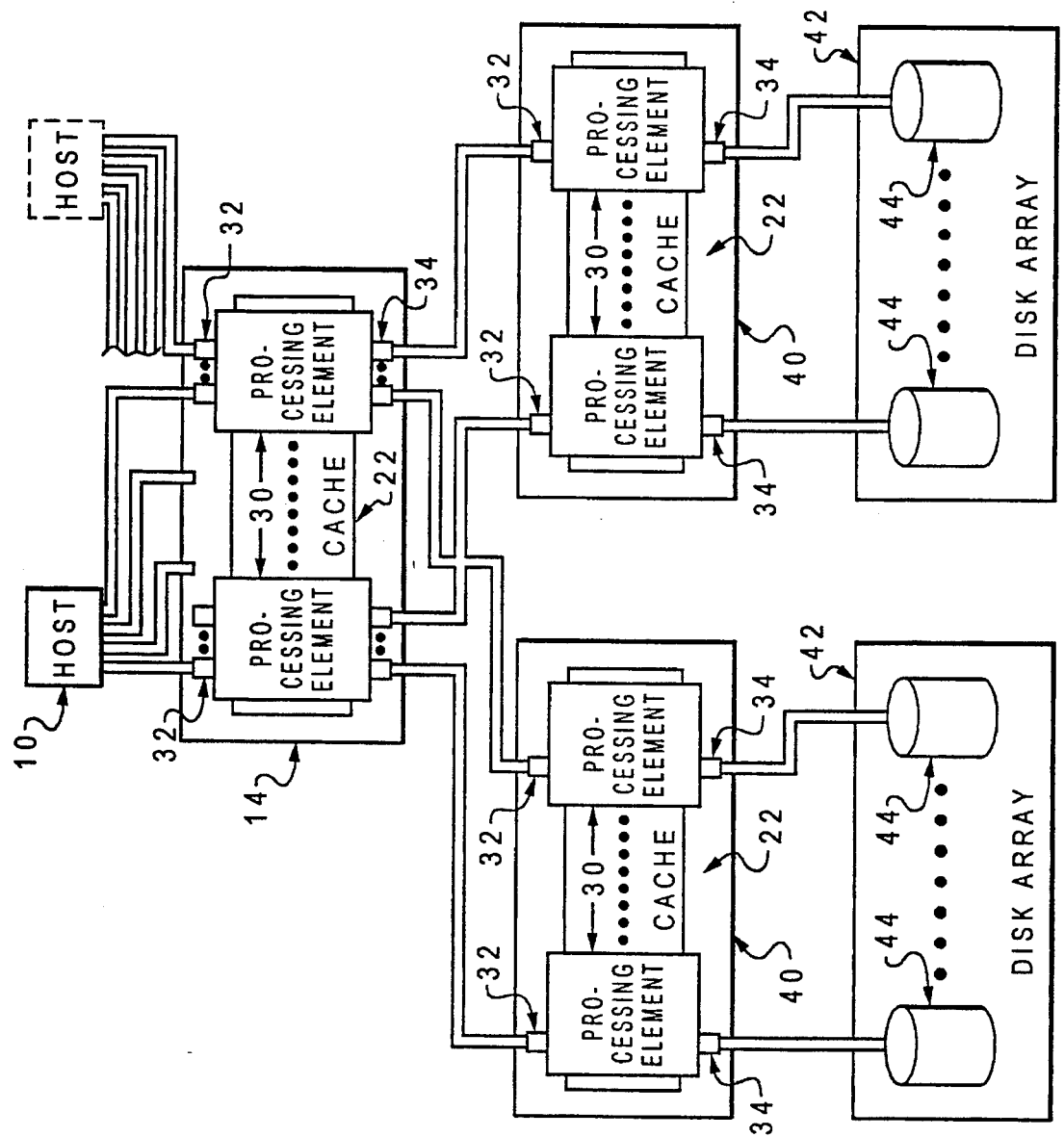
FIG. 3 is a schematic representation of a multipath dynamically alterable hierarchical arrangement of storage device controllers which may be utilized to implement the fault tolerant data storage subsystem of the present invention.

With reference now to FIG. 3, there is depicted a schematic representation of a multipath dynamically alterable hierarchical arrangement of storage device controllers which may be implemented utilizing the storage device controller of FIG. 2. As depicted, a storage device controller 14 is coupled to multiple host processor 10 over multiple channels. For clarity the multiple redundant subsystems of FIG. 2 are not depicted in FIG. 3. As illustrated, multiple host processors may be coupled to storage device controller 14 utilizing a plurality of channels and simple contention resolution techniques may be utilized to determine which host processor is permitted to access storage device controller 14 at a single moment in time.

Referring now to storage device controller 14, as illustrated within FIG. 3, only the multiple port cache and processing element section 22 of FIG. 2 is depicted. As illustrated, multiple processing elements 30 are provided. Each processing element 30 preferably comprises a processor and selected control logic to permit data coupled to an input port 32 of multiple port cache 22 to be selectively coupled to one of multiple output ports 34 of an individual processing element 30.

Next, in accordance with an important feature of the present invention, selected output ports 34 of the processing elements 30 within storage device controller 14 are coupled to input ports 32 of a second group of storage device controllers 40. As noted above, since multiple port cache and processing elements 22 may be utilized in combination with storage device controller 14 to emulate a disk memory device, storage device controller 14 may write data via processing elements 30 contained therein into the input ports 32 of storage device controllers 40 in the manner depicted. Thus, storage device controllers 40 which are coupled to the output ports of storage device controller 14, may be said to implement a "virtual" storage device for purposes of illustration herein. In this manner, a highly reliable multipath dynamically alterable hierarchical arrangement of storage device controllers may be provided.

As depicted within FIG. 3, a pair of disk arrays 42, which each include multiple disk memory devices 44 may then be coupled to the output ports 34 of storage device controllers 40. Of course, as will be illustrated in greater detail herein, it is not necessary for the hierarchical arrangement depicted within FIG. 3 to be symmetrical in nature. Various combinations of different types and capabilities of storage device controllers may be utilized to implement a desired spectrum of data reliability and access speed.

Figure 4:
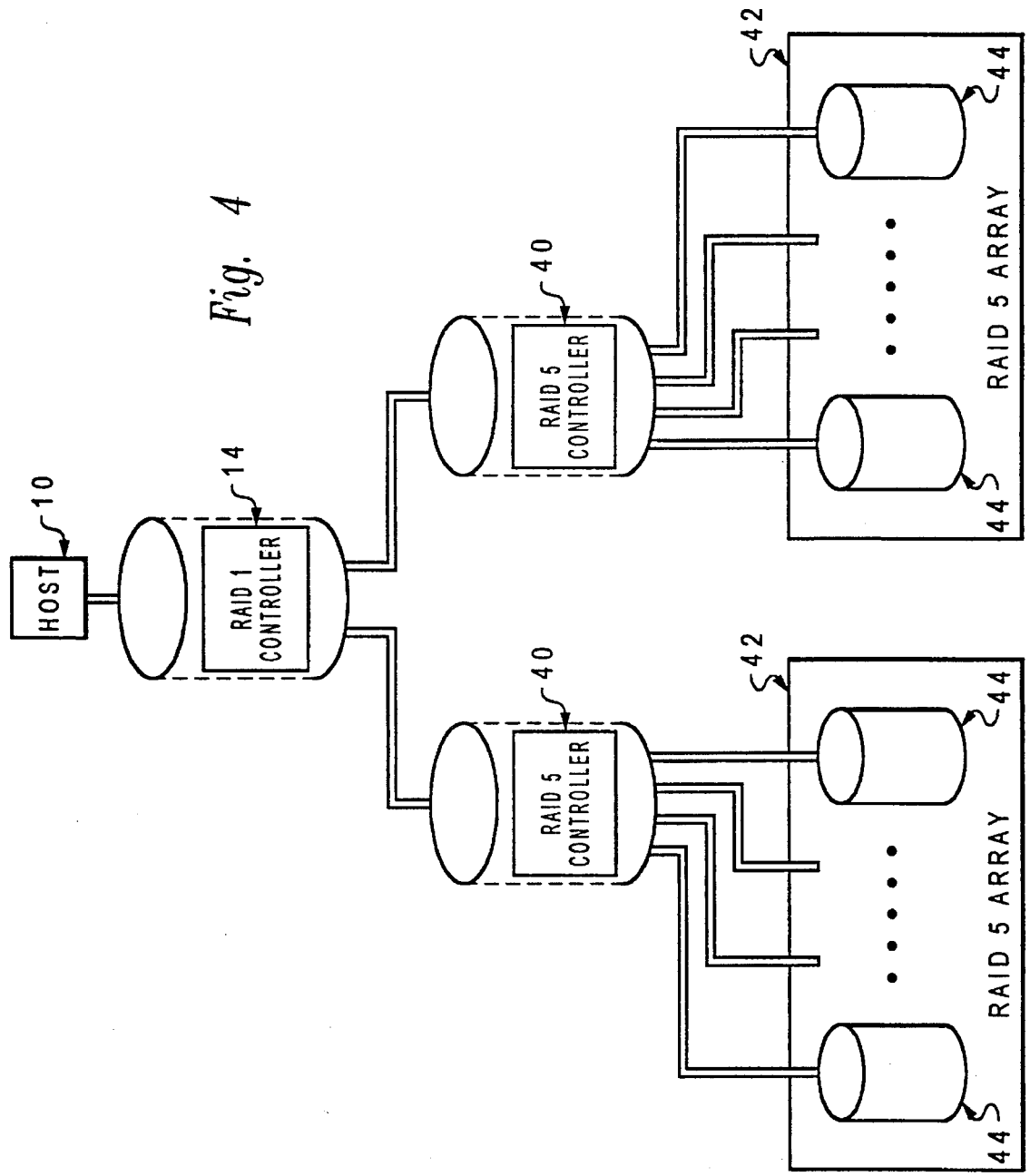
FIG. 4 is a schematic representation of one embodiment of a multipath dynamically alterable hierarchical arrangement of storage device controllers which includes various controller types.

Referring now to FIG. 4, there is depicted a schematic representation of one embodiment of such a combination of storage device controllers in a multipath dynamically alterable hierarchical arrangement which includes various controller types. As depicted within FIG. 4, a host processor 10 is coupled to a storage device controller 14 which implements a RAID 1 type controller. As discussed above, storage device controller 14, implementing a RAID 1 type controller, will appear as a virtual storage device to host processor 10. Those skilled in the art will appreciate that a RAID 1 controller implements the simplest approach to data reliability. A RAID 1 controller utilizes so-called "mirrored" disks in which data written to the controller is duplicated within two disk storage devices. This approach is fairly common in systems which utilize extremely valuable data. However, such systems require that each data write be applied to both disks within a pair. Also, since the data is duplicated within the mirrored disks, access time may be decreased since each data read may be applied to the disk having the shorter seek to the desired data.

Next, in accordance with an important element of the present invention, the outputs of storage device controller 14 are each coupled to an alternate storage device controller 40. In the depicted embodiment within FIG. 4, each storage device controller 40 is utilized to implement a so-called RAID 5 controller. As above, since each storage device controller emulates a storage device, the outputs of storage device controller 14 are coupled to storage device controllers 40 and the RAID 1 controller implemented within storage device controller 14 may be said to be writing data to the two virtual disk memory devices provided by this emulation.

Finally, a RAID 5 disk array 42 is provided and coupled to the output of each storage device controller 40. Each RAID 5 disk array 42 preferably includes multiple disk memory devices 44 and, as those skilled in the art will appreciate, a RAID 5 array is implemented utilizing a technique which stripes data and check information across each disk within the array. RAID 5 arrays typically provide small read-modify-write performance close to the speed per disk of a RAID 1 system, while maintaining a large transfer performance per disk and high useful storage capacity percentages. By spreading the data across multiple disks within a RAID 5 array, the access performance penalty associated with such arrays is decreased.

As those skilled in the art will appreciate upon reference to FIG. 4, the multipath dynamically alterable hierarchical arrangement of storage device controllers depicted therein permits a combination of the features of RAID 1 technology with RAID 5 technology in a manner not previously permitted utilizing data storage subsystems known in the prior art.

Figure 5:
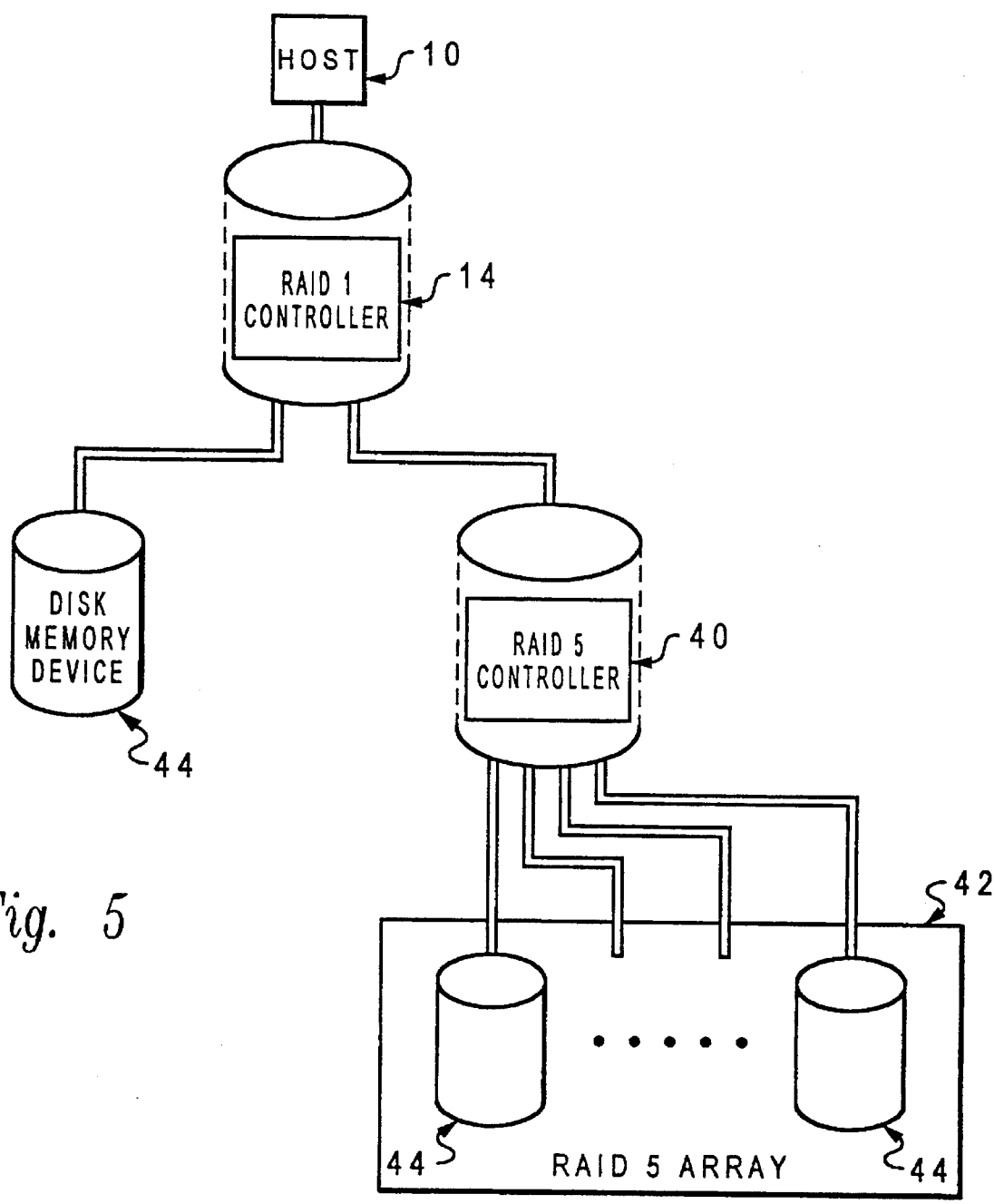
FIG. 5 is a schematic representation of a second embodiment of a multipath dynamically alterable hierarchical arrangement of storage device controllers which includes various controller types.

Finally, with reference to FIG. 5, there is depicted a schematic representation of a second embodiment of a multipath dynamically alterable hierarchical arrangement of storage device controllers which is nonsymmetrical in nature. As described above with respect to FIG. 4, a storage device controller 14 which implements a RAID 1 controller is coupled to host processor 10. As storage device controller 14 has an input which emulates a disk memory device, host processor 10 may simply and efficiently store data utilizing storage device controller 14.

However, in contrast to the symmetrical hierarchical relationship depicted within FIG. 4, the embodiment depicted within FIG. 5 utilizes an actual disk memory device 44 for one of the two mirrored disks in a RAID 1 system. The other output of storage device controller 14, to be coupled to a second mirrored disk device, is coupled to storage device Controller 40, which implements a RAID 5 controller in the embodiment depicted within FIG. 5. As above, a RAID 5 disk array 42 Is then coupled to the output of storage device controller 443. RAID 5 disk array 42 preferably includes multiple disk memory devices 44 in a manner well known to those having ordinary skill in the art.

Thus, upon reference to FIG. 5, those skilled in the art will appreciate that utilizing the multipath dynamically alterable hierarchical arrangement of storage device controllers described within the present application, a mixture of storage device controller types and capabilities may be created which is particularly applicable to the desired system parameters for a particular system. By utilizing storage device controller 14 to implement a RAID 1 type controller, and by mirroring the data to be stored within disk memory device 44, which is coupled to storage device controller 14, and within a RAID 5 disk array 42, via storage device controller 40, the access speed of a single disk memory device may be effectively combined with the data reliability of a disk array. By providing storage device controllers having inputs which emulate the input to a storage device, and by interconnecting those storage device controllers in the manner depicted herein, a data storage subsystem may be created which is tailored to precise specifications for a particular data processing system.

While the invention has been particularly shown and described with reference to a preferred embodiment, it will be understood by those skilled in the art that various changes in form and detail may be made therein without departing from the spirit and scope of the invention.

We claim:

1. A fault tolerant data storage subsystem, said data storage subsystem comprising:

a plurality of storage device controllers adapted to emulate a storage device, each storage device controller having a cache memory which includes multiple data input ports, multiple data output ports and at least one processing element for selectively interconnecting a selected data input port with a selected data output port within said cache memory;

an interconnection for coupling a data output port of said cache memory within a first storage device controller with a data input port of said cache memory within a second storage device controller; and a first storage device selectively coupled to a dam output port of said cache memory within said second storage device controller wherein a multipath dynamically alterable hierarchical arrangement of storage device controllers is established.

2. The fault tolerant data storage subsystem according to claim 1, further including a second interconnection for coupling a data output port of said cache memory within said first storage device controller with a data input port of said cache memory within a third storage device controller.

3. The fault tolerant data storage subsystem according to claim 2, further including a second storage device selectively coupled to a data output port of said cache memory within said third storage device controller.

4. The fault tolerant data storage subsystem according to claim 1, further including a second storage device coupled to a data output port of said cache memory within said first storage device controller.

5. The fault tolerant data storage subsystem according to claim 2, wherein said first storage device controller comprises a RAID 1 controller.

6. The fault tolerant data storage subsystem according to claim 5, wherein said second storage device controller comprises a RAID 5 controller.

7. The fault tolerant data storage subsystem according to claim 6, wherein said third storage device controller comprises a RAID 5 controller.

8. The fault tolerant data storage subsystem according to claim 1, wherein each of said plurality of storage device controllers includes a plurality of redundant power supplies.

9. The fault tolerant data storage subsystem according to claim 1, wherein each of said plurality of storage device controllers includes a plurality of redundant cooling fans.

10. A data processing system comprising;

a host processor;

a plurality of storage device controllers adapted to emulate a storage device, each storage device controller having a cache memory which includes multiple data input ports, multiple data output ports and at least one processing element for selectively interconnecting a selective data input port with a selected data output port within said cache memory;

a first interconnection for coupling said host processor to a data input port of said cache memory within a first storage device controller;

a second interconnection for coupling a data output port of said cache memory within said first storage device controller with a data input port of said cache memory within a second storage device controller; and a first storage device selectively coupled to a data output port of said cache memory within said second storage device controller wherein a multipath dynamically alterable hierarchical arrangement of storage device controllers is established.

11. The data processing system according to claim 10, further including a third interconnection for coupling a data output port of said cache memory within said first storage device controller with a data input port of said cache memory within a third storage device controller.

12. The data processing system according to claim 11, further including a second storage device selectively coupled to a data output port of said cache memory within said third storage device controller.

13. The data processing system according to claim 10, further including a second storage device coupled to a data output port of said cache memory within said first storage device controller.

14. The data processing system according to claim 11, wherein said first storage device controller comprises a RAID 1 controller.

15. The data processing system according to claim 14, wherein said second storage device controller comprises a RAID 5 controller.

16. The data processing system according to claim 15, wherein said third storage device controller comprises a RAID 5 controller.

17. The data processing system according to claim 10, wherein each of said plurality of storage device controllers includes a plurality of redundant power supplies.

18. The data processing system according to claim 10, wherein each of said plurality of storage device controllers includes a plurality of redundant cooling fans.

\* \* \* \* \*